United States Patent
Le et al.

(10) Patent No.: US 11,095,299 B1
(45) Date of Patent: Aug. 17, 2021

(54) ADC HAVING ADJUSTABLE THRESHOLD LEVELS FOR PAM SIGNAL PROCESSING

(71) Applicants: Michael Q. Le, Laguna Niguel, CA (US); Mrunmay Talegaonkar, Laguna Hills, CA (US)

(72) Inventors: Michael Q. Le, Laguna Niguel, CA (US); Mrunmay Talegaonkar, Laguna Hills, CA (US)

(73) Assignee: SITRUS TECHNOLOGY CORPORATION, Shanghai (CN)

( * ) Notice: Subject to any disclaimer, the term of this patent is extended or adjusted under 35 U.S.C. 154(b) by 0 days.

(21) Appl. No.: 17/218,017

(22) Filed: Mar. 30, 2021

Related U.S. Application Data

(60) Provisional application No. 63/002,310, filed on Mar. 30, 2020.

(51) Int. Cl.
| | |
|---|---|
| *H03M 1/06* | (2006.01) |
| *H03M 1/12* | (2006.01) |
| *H04L 25/49* | (2006.01) |

(52) U.S. Cl.
CPC ....... *H03M 1/0658* (2013.01); *H03M 1/0636* (2013.01); *H03M 1/126* (2013.01); *H04L 25/4917* (2013.01)

(58) Field of Classification Search
CPC ...... H03M 1/12; H03M 1/181; H03M 1/1033; H03M 1/1215; H03M 1/1028; H03M 1/46; H03M 1/1023; H03M 1/38; H03M 7/3059; H03M 1/0607; H03M 1/1245; H03M 1/365; H03M 1/468; H03M 1/56; H03M 1/123; H03M 1/129; H03M 1/361; H03M 1/1205; H03M 3/458; H03M 1/1235; H03M 1/44; H03M 1/687; H03M 1/0658; H03M 1/0636; H03M 1/126
USPC ................................ 341/118, 119, 120, 155
See application file for complete search history.

(56) References Cited

U.S. PATENT DOCUMENTS

| | | | | |
|---|---|---|---|---|
| 6,081,215 A | * | 6/2000 | Kost | H03M 1/1028 341/118 |
| 6,784,820 B1 | * | 8/2004 | Casalegno | H03M 1/181 341/155 |
| 6,867,717 B1 | * | 3/2005 | Ion | H04N 5/20 341/118 |
| 9,337,993 B1 | * | 5/2016 | Lugthart | H04L 7/0054 |
| 9,602,121 B2 | * | 3/2017 | Ali | H03M 1/361 |
| 9,735,794 B1 | * | 8/2017 | Paul | H03M 1/002 |
| 9,998,134 B1 | * | 6/2018 | Stepanovic | H03M 1/1014 |

(Continued)

*Primary Examiner* — Linh V Nguyen
(74) *Attorney, Agent, or Firm* — Burdick Patents, P.A.; Sean D. Burdick

(57) ABSTRACT

An ADC system dynamically adjusts threshold levels used to resolve PAM signal amplitudes into digital values. The ADC circuitry includes an analog front end to receive and condition the PAM signal, a low-resolution ADC to digitize the conditioned signal according to a first set of threshold values, and a high-resolution ADC to subsample the conditioned signal to generate subsampled signals. A microprocessor in communication with the low-resolution ADC and the high-resolution ADC derives a statistical value from the subsampled signals, determines an updated set of threshold values, and dynamically replaces the first set of threshold values for the low-resolution ADC with the updated set of threshold values.

20 Claims, 11 Drawing Sheets

(56) References Cited

U.S. PATENT DOCUMENTS

| | | | |
|---|---|---|---|
| 2003/0063020 A1* | 4/2003 | Masenas | H03M 1/1033 341/120 |
| 2007/0176805 A1* | 8/2007 | Stewart | H03M 3/388 341/118 |
| 2013/0027236 A1* | 1/2013 | Yamase | H03M 1/0656 341/122 |
| 2019/0190528 A1* | 6/2019 | Lassen | G01R 31/3648 |
| 2020/0162099 A1* | 5/2020 | Perrott | H03G 3/301 |

* cited by examiner

ADC HAVING ADJUSTABLE THRESHOLD LEVELS FOR PAM SIGNAL PROCESSING

BACKGROUND OF THE INVENTION

Related Applications

This application claims priority to U.S. Provisional Application 63/002,310 that was filed Mar. 30, 2020 and which is fully incorporated herein by reference. This application is related to U.S. application Ser. No. 16/984,096 that was filed on Aug. 3, 2020 and which is also fully incorporated herein by reference.

Field of the Invention

The present invention relates generally to digital communication systems, and more specifically to an apparatus and method for setting threshold levels for analog-to-digital conversion of PAM signals.

DESCRIPTION OF RELATED ART

Real world natural signals are analog signals that are continuous in time and amplitude. In modern communication systems, an analog-to-digital converter (ADC) is used to digitize the analog signal into a binary representation of discrete amplitudes evenly spaced by uniform a time interval. The time interval by which the analog input signal is digitized is called the sampling rate, for example, one sample every 40 picoseconds equates to a sampling rate of 25 G samples per second (25 GS/s). In circuit implementations, an ADC is typically preceded by an analog front end (AFE) and sometimes an analog equalizer (EQ) to receive and condition the analog signal before conversion by the ADC.

To convert an analog signal having amplitude that varies continuously into a digital representation of discrete amplitudes, the ADC establishes threshold levels to decide whether a sampled analog amplitude that lies between adjacent discrete digital amplitudes should be given the higher discrete value or the lower discrete value. An example is given in FIGS. 1-2. FIG. 1 shows an analog signal 10 having an amplitude A that varies in the vertical direction over time t. FIG. 2 shows a digital representation 20 of signal 10 by a 6-bit ADC that samples signal 10 at a sampling rate of one sample per time interval, where the time interval T is equal to the width of a rectangular pulse. Each time the 6-bit ADC samples signal 10, it compares the sampled amplitude to a threshold and, based on that comparison, assigns a 6-bit number K between 000000 (zero) and 111111 (63), where 111111 corresponds to the analog input amplitude (e.g. voltage) being greater than a threshold of 1.0, as shown at sample 21. A series of thresholds are thereby set for every $\frac{1}{63}$rd fraction of amplitude. For example, if the sampled analog signal lies between 40/63 and 41/63, e.g. at sample 22, the sampled amplitude exceeds the 40/63 threshold but is less than the 41/63 threshold, and so the digitized amplitude is assigned a value of 40/63, and represented as 101000.

Computer-based data transmission typically uses an NRZ (PAM2) coding scheme or a PAM4 coding scheme. Compared to NRZ, PAM4 offers certain advantages. For the same baud rate, PAM4 coding has half the Nyquist frequency and twice the throughput, because, with PAM4 each voltage level (or "symbol") represents two bits of information. Many benefits arise from halving the Nyquist frequency, including doubling the density of data, achieving higher resolution using the same oversampling rate, and having the same total noise power spread over a wider frequency so that the noise power in bandwidth diminishes. But there are also some disadvantages. The PAM4 signal has ⅓ the amplitude of a similar NRZ signal, and consequently, the PAM4 signal has a less desirable signal-to-noise ratio (SNR). That is a result of the tighter spacing between voltage levels in PAM4 signaling, making a PAM4 signal generally more susceptible to noise.

FIG. 3 shows an eye diagram 30 that illustrates PAM4 modulation. In PAM4 signal processing, the analog signal is modulated to represent any one of four nominal levels of amplitude. The eye diagram shows multiple superimposed waves of a PAM4 signal as each wave transitions among the four levels. Noise and other signal impairments cause amplitude variations in the waves that are evident when the signals are superimposed. PAM4 modulation sets the nominal levels at relative magnitudes (e.g. voltages) of −3, −1, +1, +3 as shown on the left-hand side of the figure. To represent and distinguish among these four levels, a 2-bit ADC is sufficient to convert the analog signal to respective binary values of 00, 01, 10, 11. As shown on the right-hand side of FIG. 3, the 2-bit ADC uses three threshold levels −2, 0, +2 to determine which of the four nominal levels the ADC should assign to a wave sampled during the sampling period P. The 2-bit ADC therefore provides a resolution of 2.0 for a sampled signal; that is, if the sampled signal input to the ADC is less than −2, the ADC output is 00; if the input is greater than or equal to −2 but less than 0, the ADC output is 01; if the input is greater than or equal to 0 but less than +2, the ADC output is 10; and if the input is greater than or equal to +2, the ADC output is 11.

In practical systems, due to the lower SNR in PAM4 modulation and to distortion of the input signal from impairments in optical components, temperature variations, and other phenomena, sampled signal levels can erroneously cross a threshold level, resulting in "cross-threshold" error in the binary output of the ADC. The distortion can be minor or severe and varies depending on the components used in the signal path. For example, a sampled wave that should communicate an amplitude of +1 is distorted by an error of +1.2. Sampling then returns a value of +2.2 to the ADC, which misinterprets the signal and assigns a binary value of 11. And because the SNR and signal impairment vary over time, error propagation in the ADC becomes difficult to predict and remedy.

What is needed is an advancement in ADC circuit design that minimizes cross-threshold error in PAM4 signal processing.

SUMMARY OF THE INVENTION

The present invention overcomes the foregoing problems by apparatus and methods disclosed herein that provide an ADC having adjustable threshold levels that improve overall SNR in circuitry receiving an analog data signal. The invention uses a low-resolution, high-speed ADC to sample and convert a PAM signal to digital form by resolving signal amplitudes using a set of threshold levels. A high-resolution, low-speed ADC subsamples input to the low-resolution, high-speed ADC and stores data from which statistical values may be derived representing amplitude variations that arise from signal impairment. The low-speed, high resolution ADC then dynamically updates the threshold levels used by the low-resolution, high-speed ADC to improve SNR and reduce the overall error rate. The invention has particular application in PAM4 signal processing.

One embodiment of the invention provides receiving circuitry in communication with an optical or electrical medium. The receiving circuitry includes an analog front end (AFE) to convert an analog signal received from the optical or electrical medium into an analog conditioned signal, a low-resolution analog-to-digital converter (ADC) to digitize the analog conditioned signal according to a first set of threshold values, and a high-resolution ADC to subsample the analog conditioned signal to generate a plurality of subsampled signals. A microprocessor in communication with the low-resolution ADC and the high-resolution ADC is configured to derive one or more statistical values from the plurality of subsampled signals, determine a set of updated threshold values from the one or more statistical values, and dynamically replace the first set of threshold values for the low-resolution ADC with the updated set of threshold values.

In another embodiment of circuitry according to the invention, the low-resolution ADC is further configured to digitize the analog conditioned signal according to a first set of nominal values. The microprocessor is configured to determine a set of updated nominal values as a function of one or more statistical values. The statistical values for the nominal values or the threshold values may be a mean, a standard deviation, a peak-to-peak value, a center value, or another value predictive of signal deviation or impairment. In various other embodiments of the invention, the low-resolution ADC digitizes the analog conditioned signal by sampling the analog conditioned signal to obtain a plurality of sampled signal values, comparing the plurality of sampled signal values with the first set of threshold values, and assigning binary codes to the sampled signal values based on the comparison. In another embodiment of the invention, circuitry for dynamically adjusting ADC thresholds includes a plurality of low-resolution ADCs and a plurality of high-resolution ADCs that respectively sample and subsample an analog conditioned signal and digitize it to a series of binary values.

Another embodiment of the invention is disclosed as a system on a chip (SOC) configured to digitize a four-level pulse amplitude modulated (PAM) signal. The SOC includes a low-resolution ADC to receive and digitize an analog conditioned signal according to a first set of threshold values, a high-resolution ADC to subsample the analog conditioned signal to generate a plurality of subsampled signals, and a microprocessor in communication with the low-resolution ADC and the high-resolution ADC. The microprocessor is configured to derive one or more statistical values from the plurality of subsampled signals, determine a set of updated threshold values from the one or more statistical values, and dynamically replace the first set of threshold values for the low-resolution ADC with the updated set of threshold values.

Another embodiment of the invention is disclosed as a method to improve signal-to-noise ratio (SNR) in a communication system susceptible to signal impairment by an optical or electrical medium. The method includes the following salient steps: receiving an incoming signal and conditioning the incoming signal to form a conditioned signal, sampling the conditioned signal according to a first set of threshold values, subsampling the conditioned signal to obtain a plurality of subsampled signals, deriving one or more statistical values from the plurality of subsampled signals, determining a set of updated threshold values from the one or more statistical values, and replacing the first set of threshold values with the updated set of threshold values and sampling a subsequent conditioned signal according to the updated set of threshold values.

BRIEF DESCRIPTION OF THE DRAWINGS

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims. Component parts shown in the drawings are not necessarily to scale, and may be exaggerated to better illustrate the important features of the invention. Dimensions shown are exemplary only. In the drawings, like reference numerals may designate like parts throughout the different views, wherein:

DETAILED DESCRIPTION OF THE INVENTION

The following disclosure presents apparatus and methods of the present invention for an ADC having adjustable threshold levels that improve overall SNR in circuitry receiving an analog data signal over optical, electrical, or other media. The invention uses a low-resolution, high-speed ADC to sample and convert a PAM signal to digital form by resolving signal amplitudes using a set of threshold levels. A high-resolution, low-speed ADC subsamples input to the low-resolution, high-speed ADC and stores data from which statistical values may be derived that represent amplitude variations that arise from signal impairment. The low-speed, high resolution ADC then dynamically updates the threshold levels used by the low-resolution, high-speed ADC to improve SNR and reduce the overall error rate. The invention has particular application in PAM4 signal processing.

An ADC having adjustable threshold levels for PAM4 signal processing in accordance with the principles of the present invention may use a hybrid signal processing scheme as set forth more fully in co-pending U.S. application Ser. No. 16/984,096, which is incorporated by reference herein and which is owned by the assignee of the present invention. As described in the co-pending application, the hybrid signal processing scheme receives a high-speed data signal (e.g. 25 GHz or higher) at an AFE. Prior to digitizing the high-speed signal, the signal is conditioned using an interleaving and summing technique whereby sampled signal values from interleaved analog feed-forward equalizers (FFEs) are summed with output from interleaved decision feedback equalizers (DFEs). The summed values are then converted by an ADC to generate a digital version of the data signal.

Due, however, to the low SNR and signal impairment inherent in PAM4, an ADC having a bit size greater than 2 may be employed in the present invention to capture information representing the non-uniformity (or error) present in each sample. An illustrative implementation is described herein that uses a 3-bit ADC for this purpose, though the invention is not limited to this particular bit size of ADC. The 3-bit ADC improves the resolution to 1.0 relative to a full-scale range of −3.0 to +3.0. The extra bit of information provided by the 3-bit ADC enables statistical analyses of samples, which, in turn, enables methods for dynamically adjusting ADC thresholds to improve performance.

Figure 1:
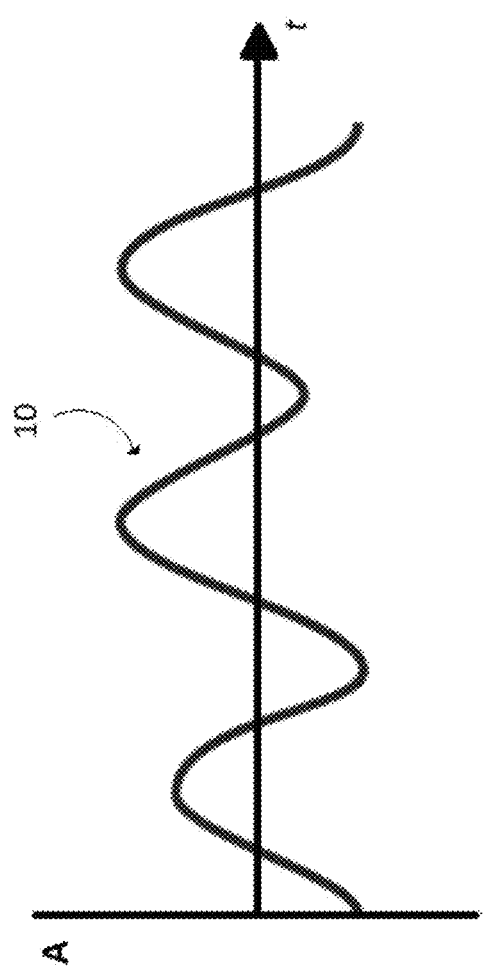
FIG. 1 is a graph of an analog carrier signal having an amplitude that varies over time.
Figure 2:
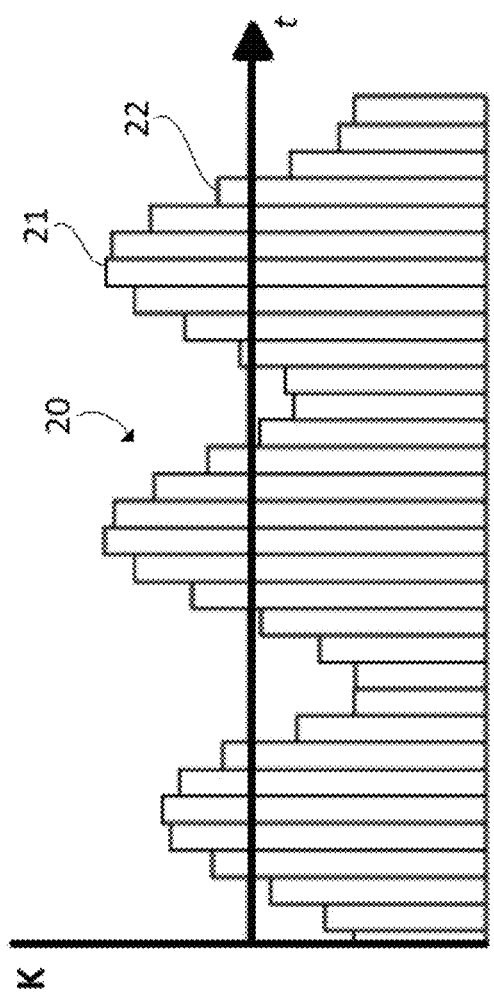
FIG. 2 is a graph of digital output of a 6-bit ADC that has sampled the analog signal of FIG. 1.
Figure 3:
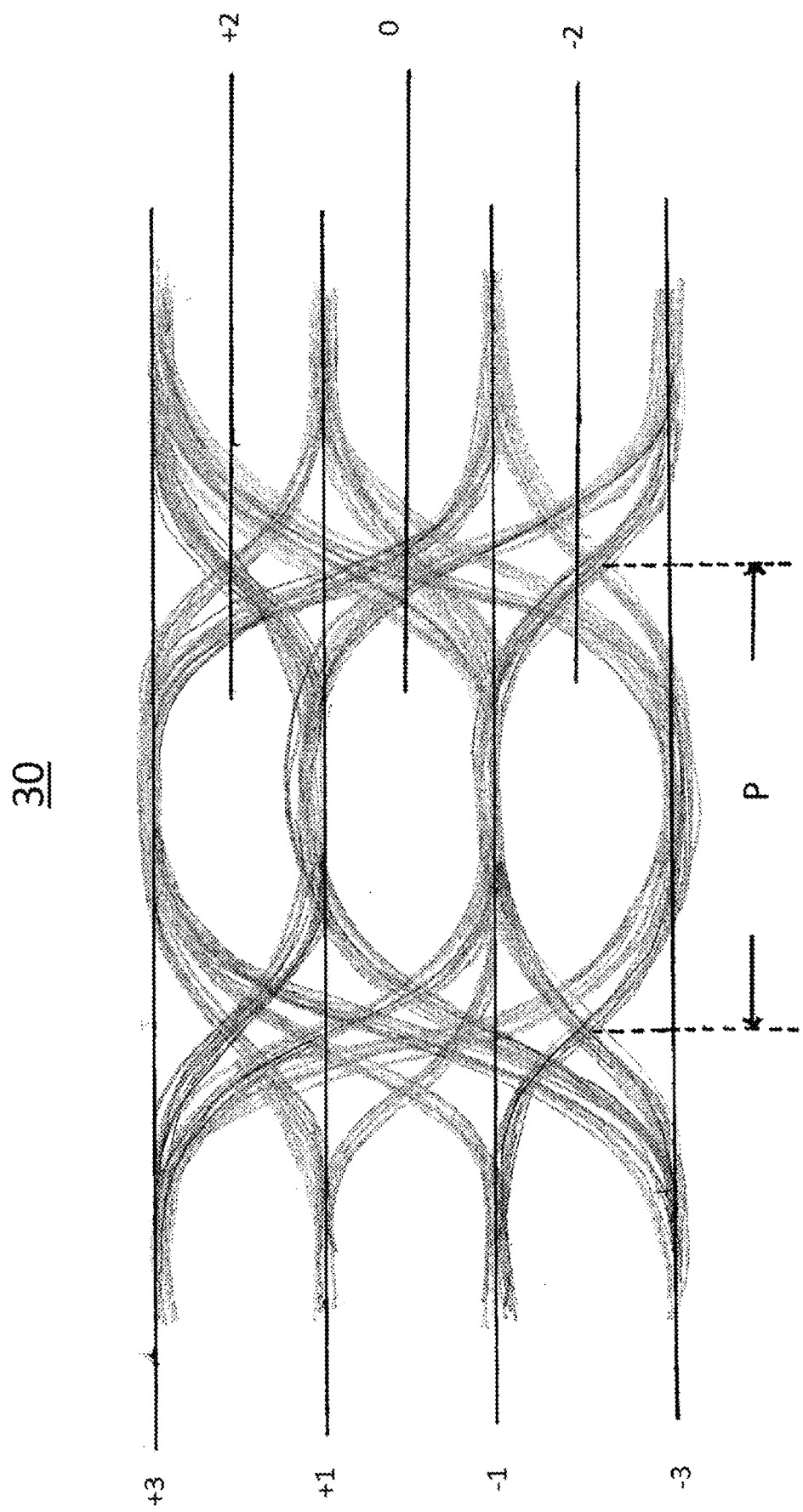
FIG. 3 is an eye diagram illustrating nominal signal levels in a conventional PAM4 scheme, along with threshold levels for analog-to-digital conversion of the data signal.
Figure 4:
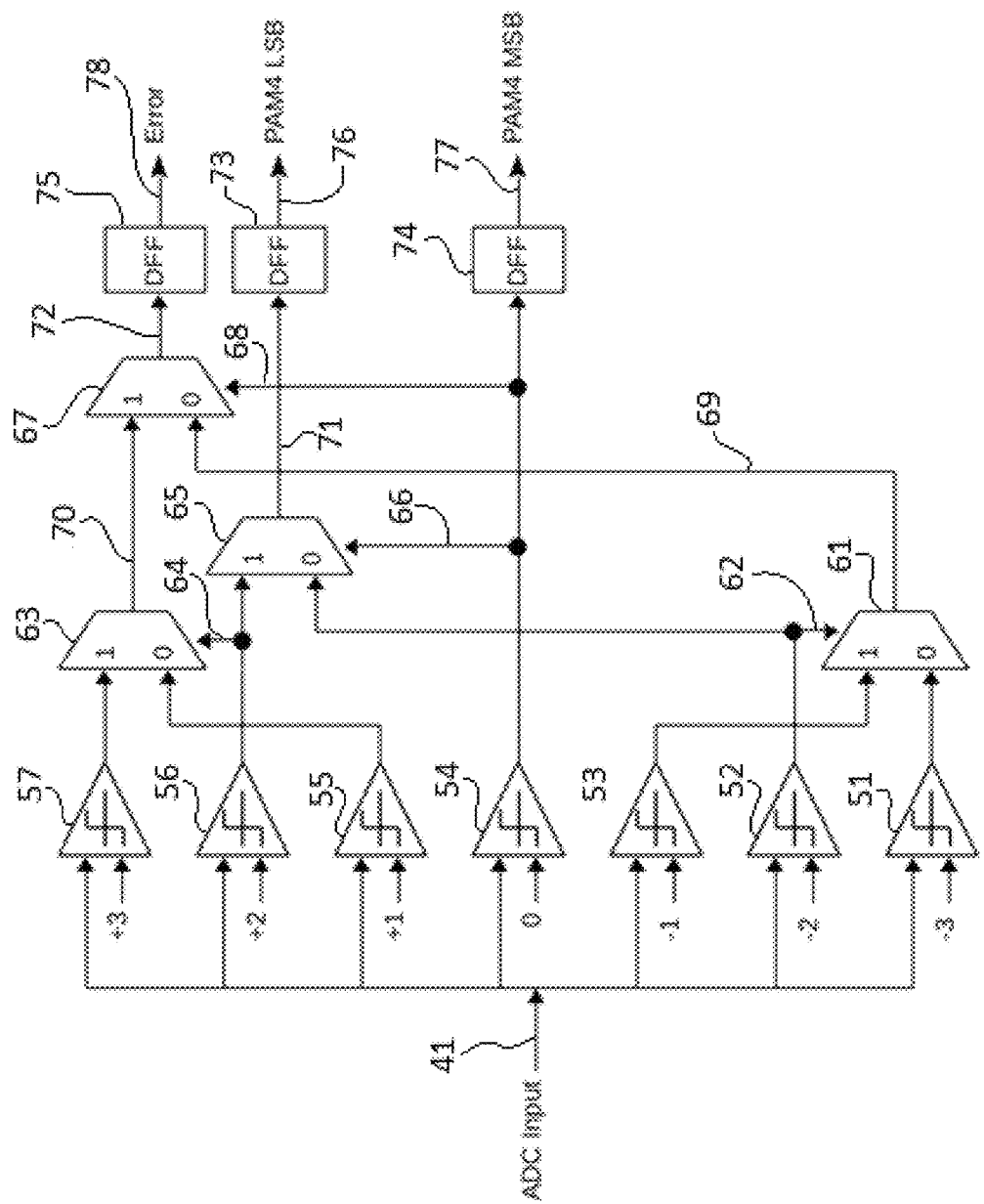
FIG. 4 is block diagram of one embodiment according to the invention of a logic circuit comprising a 3-bit flash ADC for adjusting threshold levels for PAM signal processing.

FIG. 4 shows a block diagram of one embodiment according to the invention of a logic circuit 40. Logic circuit 40 may be a 3-bit flash ADC. Circuit 40 converts an analog signal into digital form by encoding both signal level and error in binary form. The coding technique is one example illustrating a method that enables further statistical analysis of digitized samples, for use in adjusting threshold levels for PAM signal processing. At the left-hand side of the figure, an analog signal 41 is received as input to be sampled by circuit 40. In one embodiment of the invention, the signal 41 may an analog signal received by an AFE and further conditioned by an EQ stage of the overall circuit implementation shown in FIG. 5. With reference again to FIG. 4, signal 41 is fed in parallel to a comparator stage consisting of multiple comparators (CMPs), which in this example are seven CMPs 51, 52, 53, 54, 55, 56 and 57. Each CMP has two inputs and one output. The two inputs at each CMP consist of a threshold value and a signal input. Each signal input receives signal 41, as shown. The threshold value for each CMP is one of multiple different setpoints that span the desired range of amplitudes expected for the particular PAM scheme. For example, in the present PAM4 implementation, the amplitudes of the samples in signal 41 are expected to range from −3 to +3 (e.g. VDC) in evenly spaced increments of 1 unit. Thus, the sequence of threshold values for CMPs 51, 52, 53, 54, 55, 56 and 57 consists respectively of −3, −2, −1, 0, +1, +2 and +3, as shown. Each CMP functions by comparing signal 41 to its threshold. If signal 41 is equal to or less than the threshold, the output of the CMP is set to 0. If signal 41 is greater than the threshold, the output of the CMP is set to 1.

The next stage in circuit 40 is a multiplexor (MUX) stage, which processes outputs from the CMPs. Each MUX 61, 63, 65, 67 has two signal inputs—labeled 0 and 1—and one control input: 62, 64, 66 or 68, as shown. Each MUX 61, 63, 65, 67 produces one output 69, 70, 71 or 72, respectively. Each MUX signal input receives the output from one of the CMPs or the output from another MUX. Each MUX control input also receives the output from one of the CMPs. If the control input to a MUX is 0, the MUX passes to its output the signal at its 0-labeled input. If the control input to a MUX is 1, the MUX passes to its output the signal at its 1-labeled input.

The final stage in circuit 40 is an output stage that generates a 3-bit binary representation of each sample received as signal 41. Each of the three bits may be generated using a bistable logic device configured to process the outputs from one or more of the MUX devices and/or one or more of the CMP devices. In the present example, the bistable logic devices at the output stage are D flip-flops (DFFs) that are modeled as having a single input and a single output. Three DFFs 73, 74 and 75 are used in circuit 40 to respectively generate outputs 76, 77, 78, where output bit 76 represents the PAM4 least significant bit (LSB), output bit 77 represents the PAM4 most significant bit (MSB), and output 78 represents the error. Each DFF will store and output whatever logic level is applied to its input. Thus, in this example, each DFF can hold a logical output value of either 0 or 1. Together, the three DFFs comprise the 3-bit representation of a data signal that achieves the desired higher resolution in an ADC of the present invention.

In circuit 40, each CMP, MUX, and DFF may be configured using known circuit design and fabrication techniques. The number and configuration of the CMPs, MUX, and DFF devices used in an ADC according to the invention may vary depending on PAM scheme, threshold levels, desired resolution, microchip limitations or other design considerations. Sampling may be effected using a plurality of track-and-hold and sample-and-hold circuitry, to respectively sample and resample the analog conditioned signal. To better illustrate how these devices cooperate in the configuration of circuit 40 to achieve the desired 3-bit output, several numerical examples are provided in the following paragraphs.

Example 1: input signal 41=+2.9. An input signal level of +2.9 received by circuit 40 at the CMP stage will cause the following CMP outputs: CMP 51 to CMP 56=1, and CMP 57=0. As a result, at MUX 61 control signal 62=1 therefore MUX 61 passes the output of CMP 53 through so that MUX output 69=1. At MUX 63, control signal 64=1 therefore MUX 63 passes the output of CMP 57 through so that MUX output 70=0. At MUX 65, control signal 66 =1 therefore MUX 65 passes the output of CMP 56 through so that MUX output 71=1. At MUX 67, control signal 68=1 therefore MUX 67 passes output 70 through so that MUX output 72=0. At the output stage, DFF 73 passes through signal 71 therefore output 76=1. DFF 74 passes the output of CMP 54 directly therefore DFF output 77=1. And DFF 75 passes through signal 72 therefore DFF output 78=0. The final 3-bit output of circuit 40 is therefore 011. The first two digits, 11, indicate the highest of the four signal values in PAM4, which in this example is +3, which is the ADC representation of the sampled input signal. The leading bit is the error bit, where an error bit of 1 it indicates a positive error, and an error bit of 0 indicates a negative error. In this example, the leading 0 indicates negative error or an input less than +3. Thus, for a sampled value of +2.9 the ADC yields 011, which is +3 with negative error.

Example 2: input signal=+1.1. An input signal level of +1.1 received by circuit 40 at the CMP stage will cause the following CMP outputs: CMP 51 to CMP 55=1, and CMP 56 to CMP 57=0. At MUX 61 control signal 62=1 therefore MUX output 69=1. At MUX 63 control signal 64=0 therefore MUX 63 passes the output of CMP 55 through so that MUX output 70=1. At MUX 65, control signal 66=1 therefore MUX 65 passes the output of CMP 56 through so that MUX output 71=0. At MUX 67, control signal 68=1 therefore MUX 67 passes output 70 through so that MUX output 72=1. At the output stage, DFF 73 passes through signal 71 therefore output 76=0. DFF 74 output 77=1, and DFF 75 passes through signal 72 therefore DFF output 78=1. The final 3-bit output of circuit 40 is therefore 110. The first two bits, 10, represent the 3rd highest value of the PAM4 signals, or +1. The error bit 1 indicates a positive error. Thus, for a sampled value of +1.1 the ADC yields 110, which is +1 with positive error.

Example 3: input signal=−1.1. An input signal level of −1.1 received by circuit 40 at the CMP stage will cause the following CMP outputs: CMP 51 to CMP 52=1, and CMP 53 to CMP 57=0. At MUX 61 control signal 62=1 therefore MUX 61 passes through the output of CMP 53 so that MUX output 69=0. At MUX 63 control signal 64=0 therefore MUX 63 passes the output of CMP 55 through so that MUX output 70=0. At MUX 65, control signal 66 =0 therefore MUX 65 passes the output of CMP 52 through so that MUX output 71=1. At MUX 67, control signal 68=0 therefore MUX 67 passes output 69 through so that MUX output 72=0. At the output stage, DFF 73 passes through signal 71 therefore output 76=1. DFF 74 output 77=0, and DFF 75 passes through signal 72 therefore DFF output 78=0. The final 3-bit output of circuit 40 is therefore 001. The first two bits, 01, represent the 2nd highest value of the PAM4 signals, or −1. The error bit 0 indicates a negative error. Thus for an input of −1.1. the ADC yields 001, which is −1 with negative error.

Figure 5:
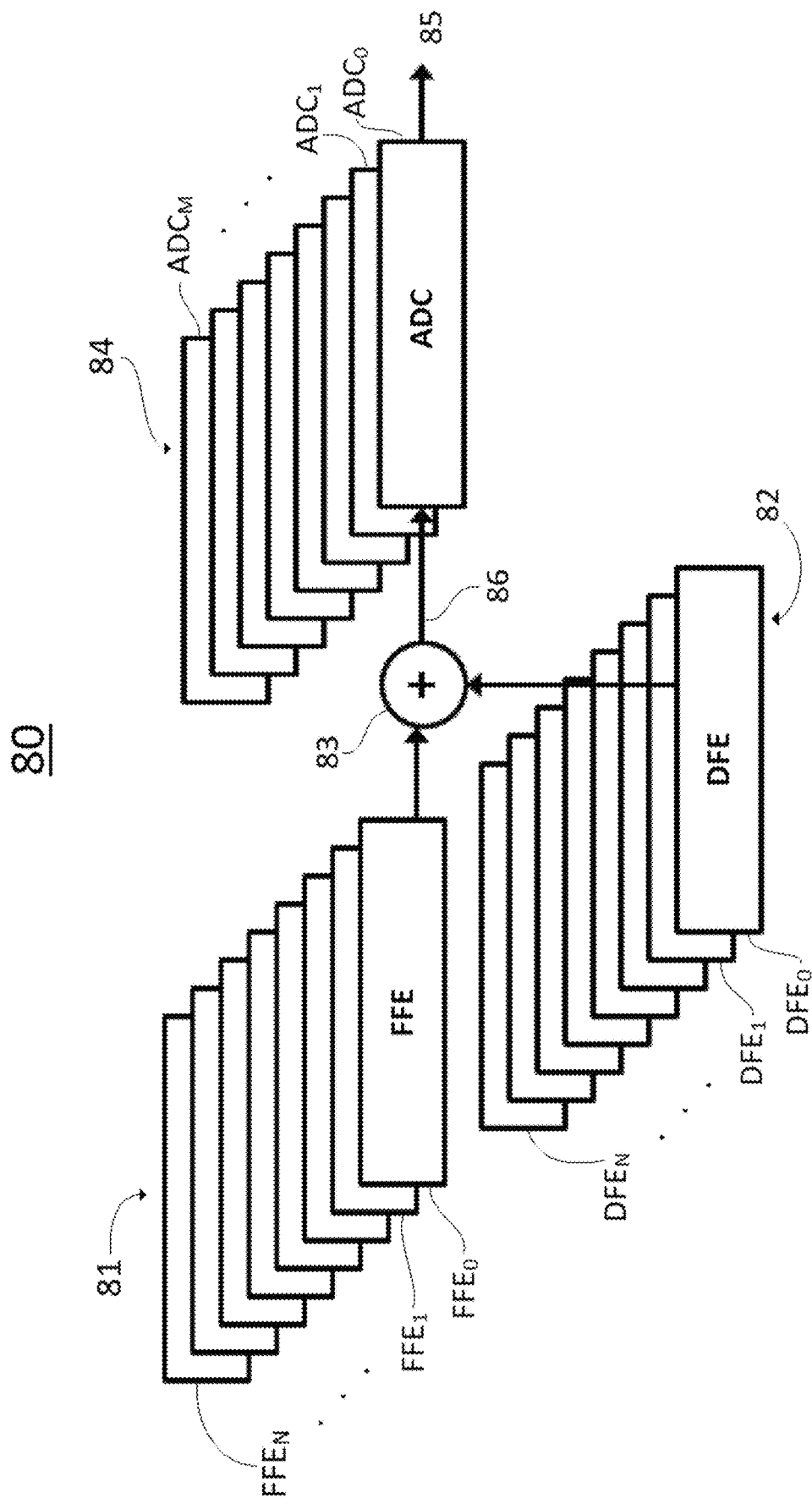
FIG. 5 is a block diagram of one embodiment of a circuit implementation of the present invention for PAM4 signal processing using an interleaved FFE, DFE, and M-bit ADC.

FIG. 5 shows a block diagram of an overall circuit implementation 80 for PAM4 signal processing according an embodiment of the invention. Circuit 80 includes an interleaved analog equalizer stage (EQ) that includes FFE 81, an interleaved analog DFE 82, and a summing stage 83. In various embodiments, one or more of components 81, 82 and 83 make up or form part of an AFE portion of receiver circuitry, which may include signal conditioning circuitry, sampling circuitry, and amplifier circuitry for amplifying or attenuating the analog signal. Operation of the interleaved FFE and DFE is described in greater detail in co-pending U.S. application Ser. No. 16/984,096. Generally, to facilitate circuit implementation in high-speed data processing applications, an analog data signal received at an AFE of the present invention preferably employs a hybrid interleaved sampling technique whereby the signal interleaved by the FFE 81 comprising $FFE_0$, $FFE_1$ ... $FFE_N$ is combined at summing stage 83 with interleaved output from DFE 82 comprising $DFE_0$, $DFE_1$ ... $DFE_N$. At 86, each output $EQ_N$ of summing stage 83 has the form $EQ_N=FFE_N+DFE_N$, where $FFE_N$ is the output of FFE 81 for the Nth sample, $DFE_N$ is the output of DFE 82 for the Nth sample, and where N is an integer. EQ outputs $EQ_0$, $EQ_1$, ... $EQ_N$ are then fed to an interleaved M-bit ADC 84, which has one bit for each interleaved analog EQ output. ADC 84 may be a high-speed, low resolution ADC configured with adjustable threshold levels for generating a digital version 85 of the data signal. M can be any number of bits, for example, 3 bits as in embodiments described above. The ADC output data 85 can then be further processed in the digital domain using digital signal processing to generate the PAM data and other useful information.

Figure 6:
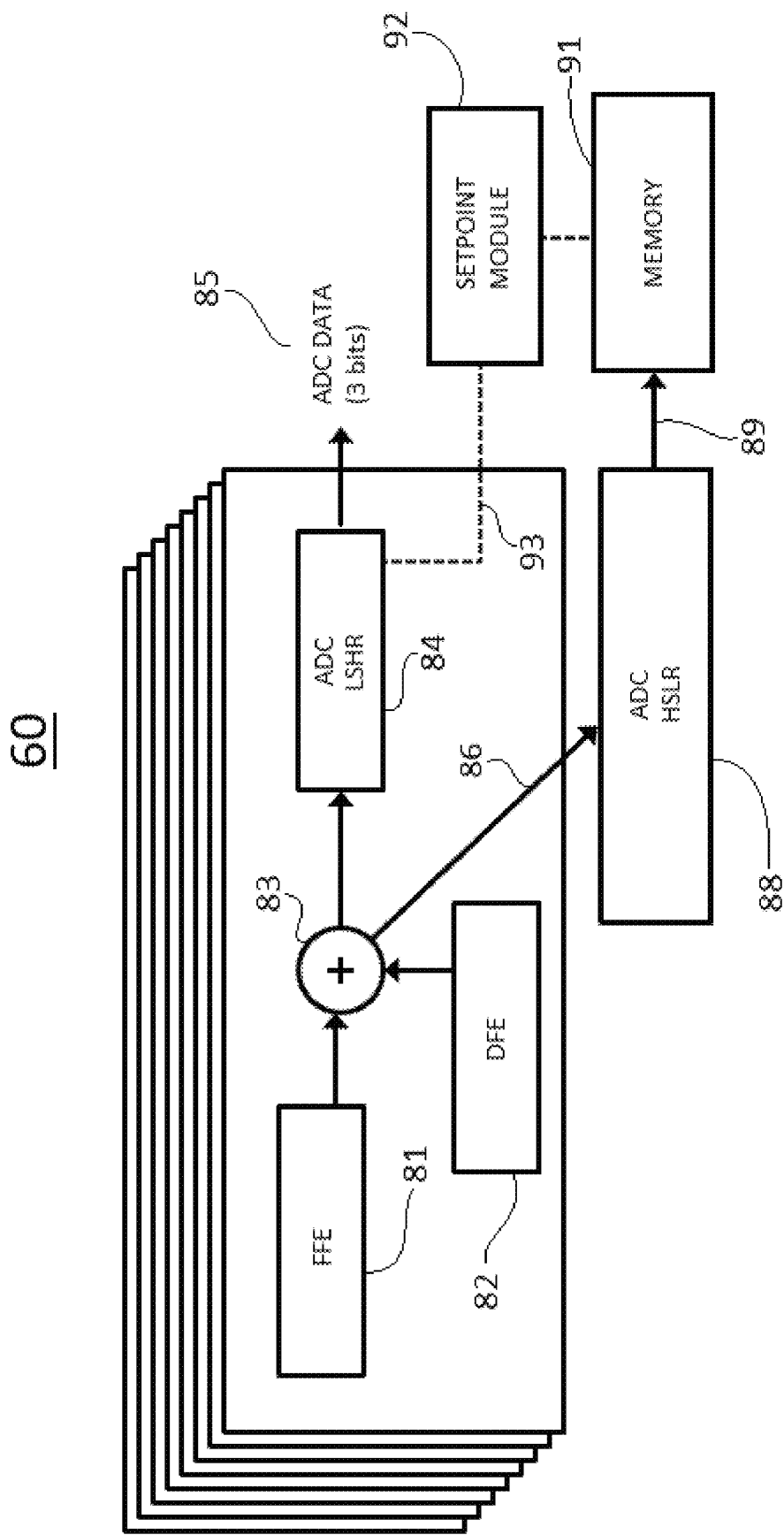
FIG. 6 is a block diagram illustrating usage of a low-speed, high resolution ADC for higher-accuracy subsampling of equalized signals for computing PAM4 threshold statistics.

FIG. 6 shows a block diagram of an overall system 60 according to the invention for an ADC having adjustable threshold levels. System 60 uses a low-speed, high resolution ADC 88 in conjunction with the high-speed, low resolution ADC 84 shown in circuit implementation 80. ADC 88 and its associated circuitry may be utilized to achieve higher-accuracy subsampling of equalized signals for computing PAM4 threshold statistics according to the invention. ADC data bits 85 are generated by the high-speed, low resolution ADC 84 of circuit 80. In the 3-bit example described herein, data bits 85 may consist of $ADC_0$ through $ADC_7$. The low-speed, high resolution ADC 88 may be connected to one or more of the summing nodes of the eight interleaved channels, such as summing node 83 in this example. ADC 88 may operate according to the same general principles described for circuit 40, but may be customized for higher resolution by generating a greater number of bits (e.g. >3) for representing a sampled signal amplitude and associated error. Accordingly, ADC 88 may be configured to subsample the equalized signal 86 by using a greater number of bits per sample than used by ADC 84 to achieve a much higher resolution for error detection among the samples. ADC 88 may advantageously operate at a lower processing speed, as its purpose is not to digitize signal 41 at the data signal transmission frequency, but rather to subsample the output 86 to compile statistics relevant to detecting variation in nominal PAM signal level displacements that occur in aggregate. In one embodiment, ADC 84 samples the analog conditioned signal, output 86, at a rate between about 100 MS/s and 100 GS/s. In the same or another embodiment, ADC 88 subsamples the output 86 at a rate between about 100 (MS/s)/n and 100 (GS/s)/m where m is an integer greater than 1.

In other embodiments of the invention, as indicated by the stacked configuration of system blocks in FIG. 6, circuitry for dynamically adjusting ADC thresholds may include a plurality of low-resolution ADCs and a plurality of high-resolution ADCs. Each pair of low and high resolution ADCs respectively sample and subsample an analog conditioned signal and digitize it to a series of binary values. Each pair in the plurality of pairs may operate on a separate data signal, or on different phases of the same data signal.

Various statistics and histograms may derived from the collection of signals subsampled by ADC 88. The ADC 88 is configured to store the subsampled signals in memory 91, generally at a capacity of k samples, each k sample having n bits resolution, where k and n are integers. The purpose of collecting these statistics is to recognize when and whether signal impairment has caused a predictable variation in the amplitude of the data signal with respect to each nominal PAM level. In one example, a statistic of interest may be the arithmetic mean of ADC outputs assigned to the highest nominal PAM level. In a PAM4 scheme, where an input level that exceeds a threshold of +2 is interpreted as +3, a setpoint module 92 by means of a microprocessor reads subsampled signals 89 stored in memory 91 by ADC 88. Then, using an executable program stored in the memory 91, the microprocessor of setpoint module 92 calculates a statistic of interest, such as the mean value for all ADC input levels that resulted in an output of +3 over predetermined time period. If the calculated mean value is +3+/−delta, the setpoint module 92 may dynamically adjust the setpoint level in the high speed, low resolution ADC to +2+/−delta and thereby improve the accuracy of the ADC system. According to the invention, setpoint module 92 may function either as an on-chip microprocessor or off-chip microprocessor. In one embodiment, as an on-chip microprocessor, setpoint module 92 forms an integral part of the circuitry of ADC 88.

As the data signal is being received and conditioned at the AFE, the low speed, high resolution ADC 88 runs in the background, monitoring input signal levels fed to the high speed, low resolution ADC 84 and storing values in memory 91 readable by the setpoint module 92 for statistical calculations for determining updated threshold values. Algorithms for determining an updated threshold values may run at system startup, periodically, or conditionally. In one implementation, when the statistics calculated by the setpoint module 92 indicate that an existing threshold level (e.g. −2, 0, +2) is sufficiently offset from an updated threshold level, the setpoint module sends a command 93 containing the updated threshold level to ADC 84. The existing threshold level in ADC 84 is then dynamically adjusted so that the existing threshold level is updated to match the updated threshold level according to the instructions of command 93. The updated threshold level thereby becomes a new existing threshold level. Dynamic adjustment of a threshold level means that the adjustment occurs while the analog signal is being received and conditioned by the AFE stage of the circuitry. In the same manner, the setpoint module 92 may update an existing nominal level (e.g. −3, −1, +1, +3). For example, the statistical analysis may calculate both a mean and a standard deviation for amplitudes that represent a particular nominal value. Command 93 may instruct ADC 84 to adjust the nominal value to match the mean, and to adjust one or more threshold values to a setpoint that matches the mean plus a multiple of the standard deviation.

Figure 7:
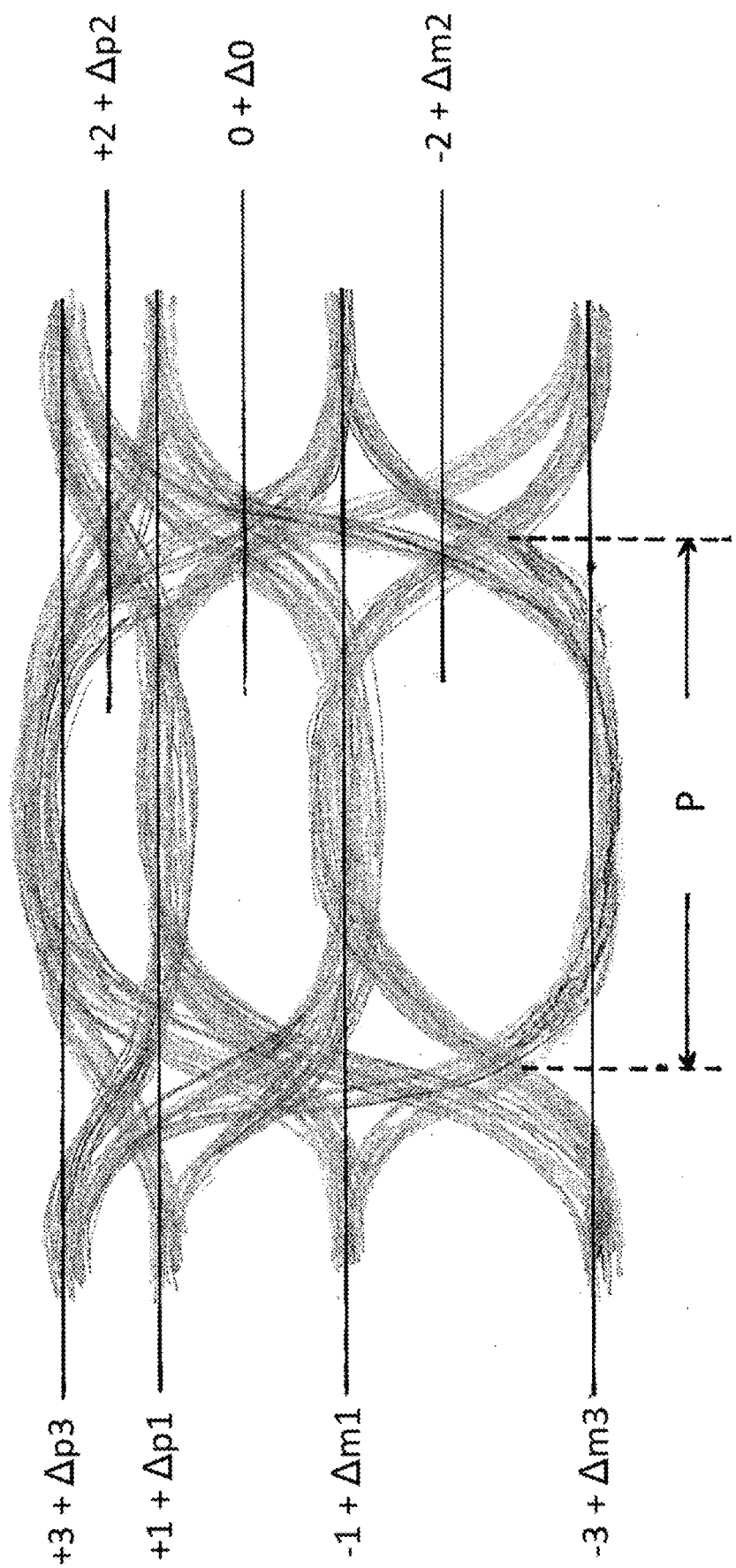
FIG. 7 is an eye diagram illustrating adjustable thresholds achieved using an ADC according to the invention in a PAM4 signal processing scheme.

FIG. 7 shows an eye diagram 90 illustrating adjustable thresholds achieved using an ADC according to the invention in a PAM4 signal processing scheme. Like diagram 30, diagram 90 shows multiple superimposed waves of a PAM4 signal as each wave transitions among four signal levels. Diagram 90 differs from diagram 30, however, because each of the existing nominal levels −3, −1, +1, +3 in diagram 30 has been adjusted in diagram 90 to the updated nominal levels −3+Δm3, −1+Δm1, +1+Δp1, +3+Δp3, and in addition, each of the existing threshold levels −2, 0, +2 in diagram 30 has been adjusted in diagram 90 to the updated threshold levels −2+Δm2, 0+ΔO, +2+Δp2. The adjustments have been made by threshold setpoint module 92 after running statistical analyses of data collected by ADC 88 that determined the updated nominal and updated threshold levels. Each adjustment is a "delta" value represented by the symbol Δ, and each delta value may be positive or negative. The notations m3, m1, p1, p3, m2, 0, and p2 indicate the nominal or threshold value to which each delta value applies.

Eye diagram 90 gives a visual indication that the updated threshold levels lie approximately at a geometric center of each of the eye-shaped spaces within sampling period P. In one embodiment, a statistical analysis run by setpoint module 92 computes a statistical value representing such geometric center.

According to the invention, setpoint module 92 periodically or conditionally runs statistical analyses and accordingly adjusts nominal and threshold setpoint levels to compensate for impairments in the data signal that vary over time. Adjusting the levels in this manner improves SNR, decreases the overall bit error rate, and generally improves ADC performance. FIGS. 8 to 11 are various charts and graphs that can be derived from data collected by the low speed, high resolution ADC 88 and stored in memory 91. The graphs provide a visual indication of the variance of signal levels processed by the ADC.

Figure 8:
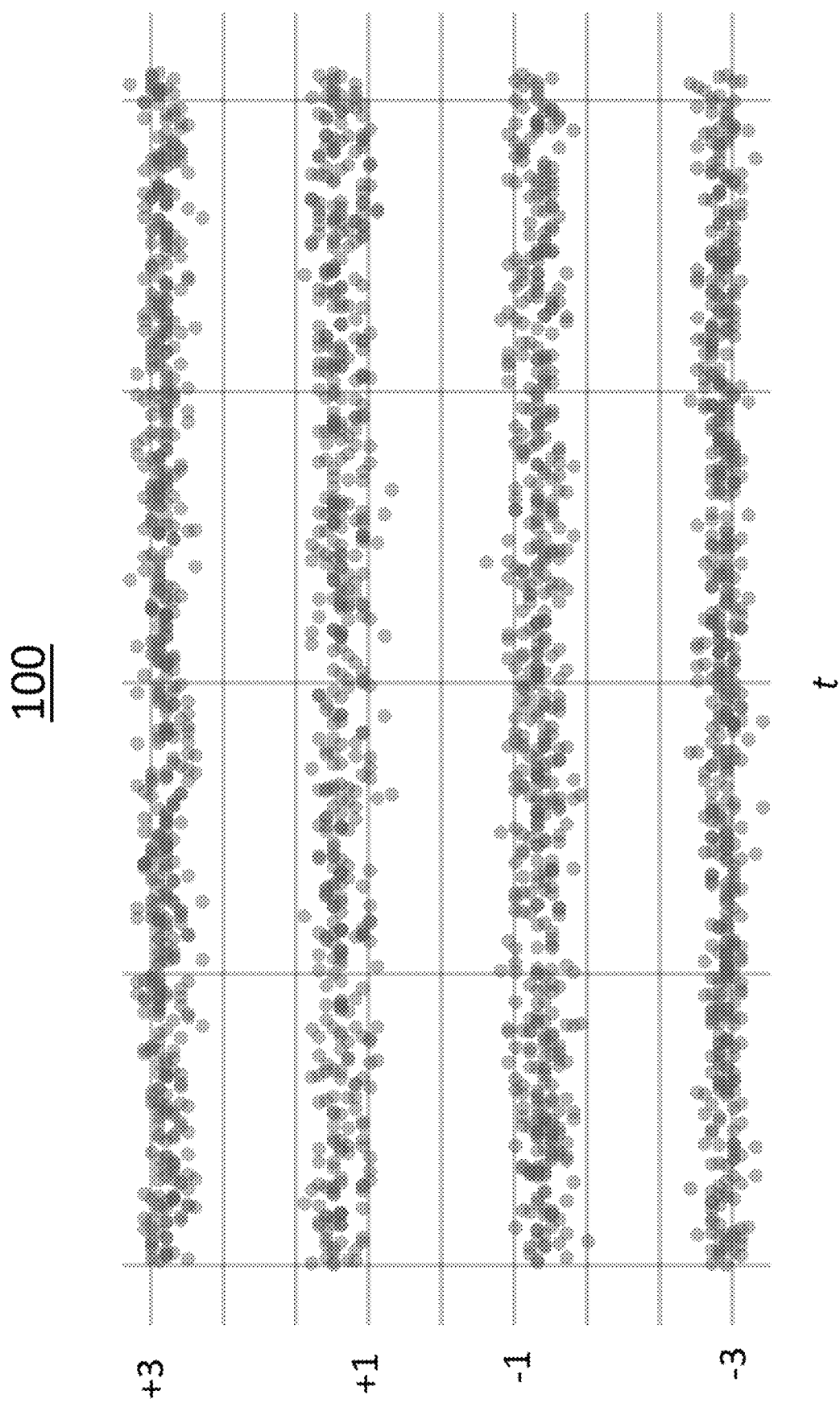
FIG. 8 is a scatter chart of samples taken from a PAM4 signal by a low-speed, high resolution ADC configured according to an embodiment of the present invention.
Figure 9:
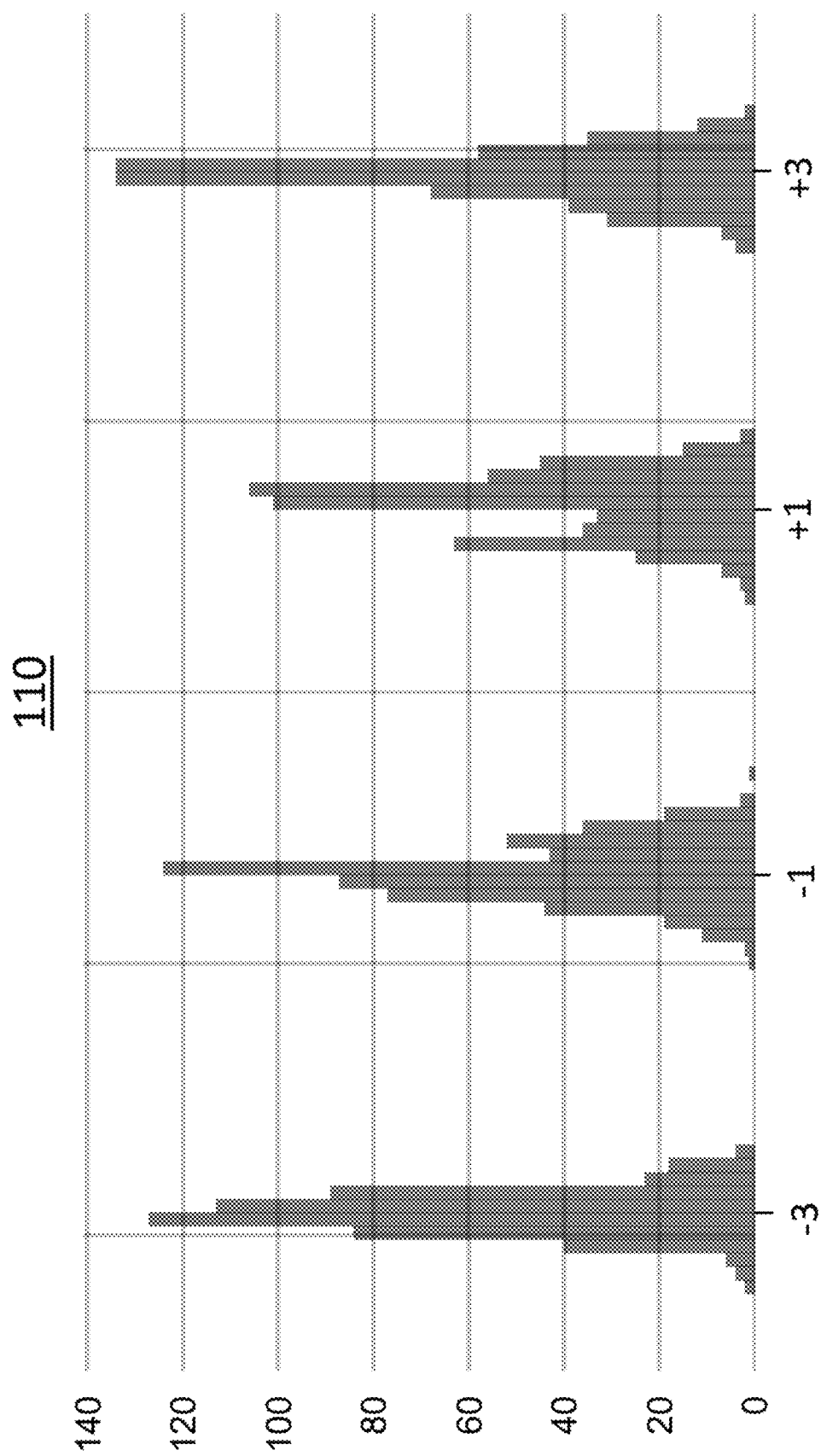
FIG. 9 is a histogram of samples taken from a PAM4 signal by a low-speed, high resolution ADC configured according to an embodiment of the present invention.
Figure 10:
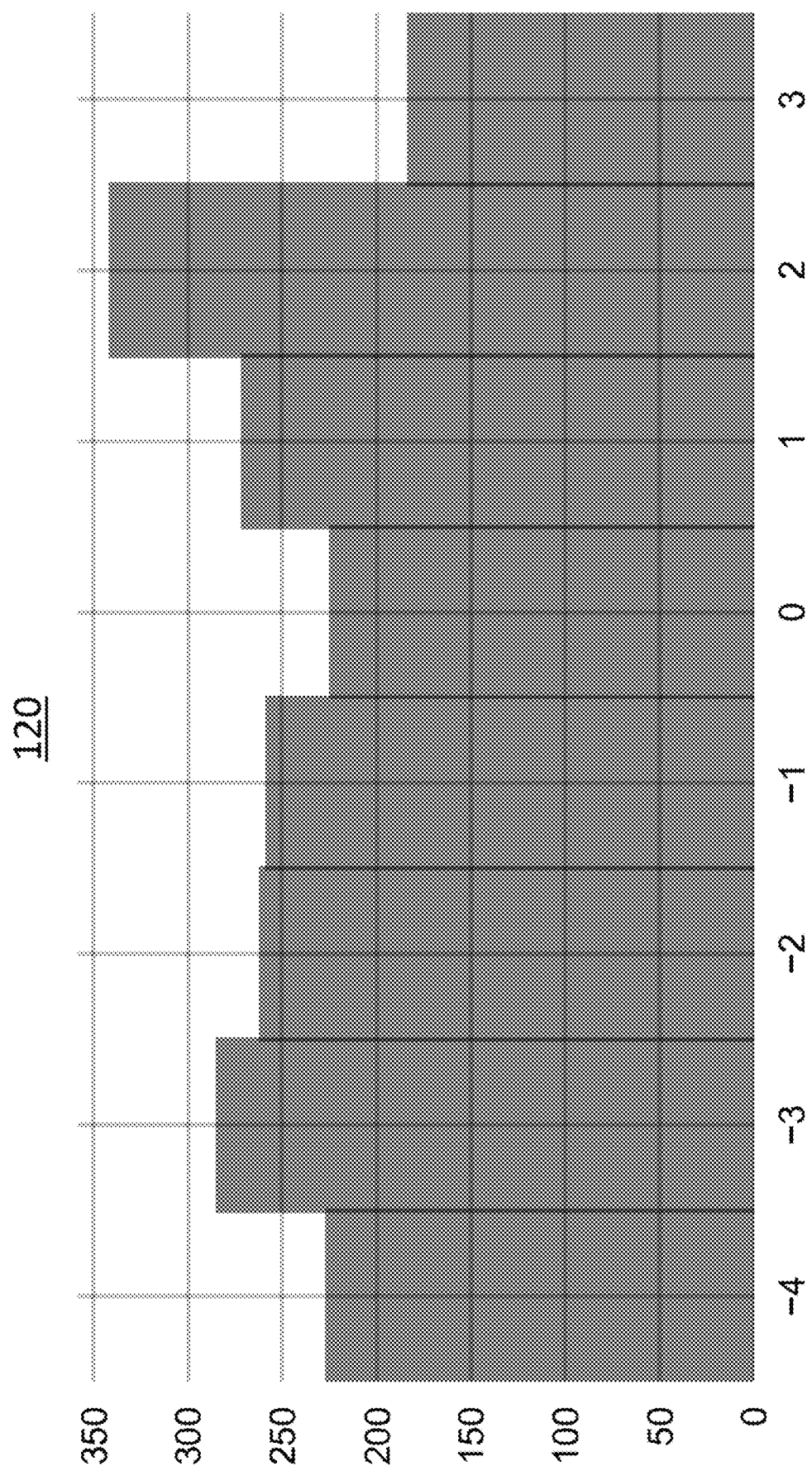
FIG. 10 is a bar graph showing a statistical distribution of CMP slice bins.
Figure 11:
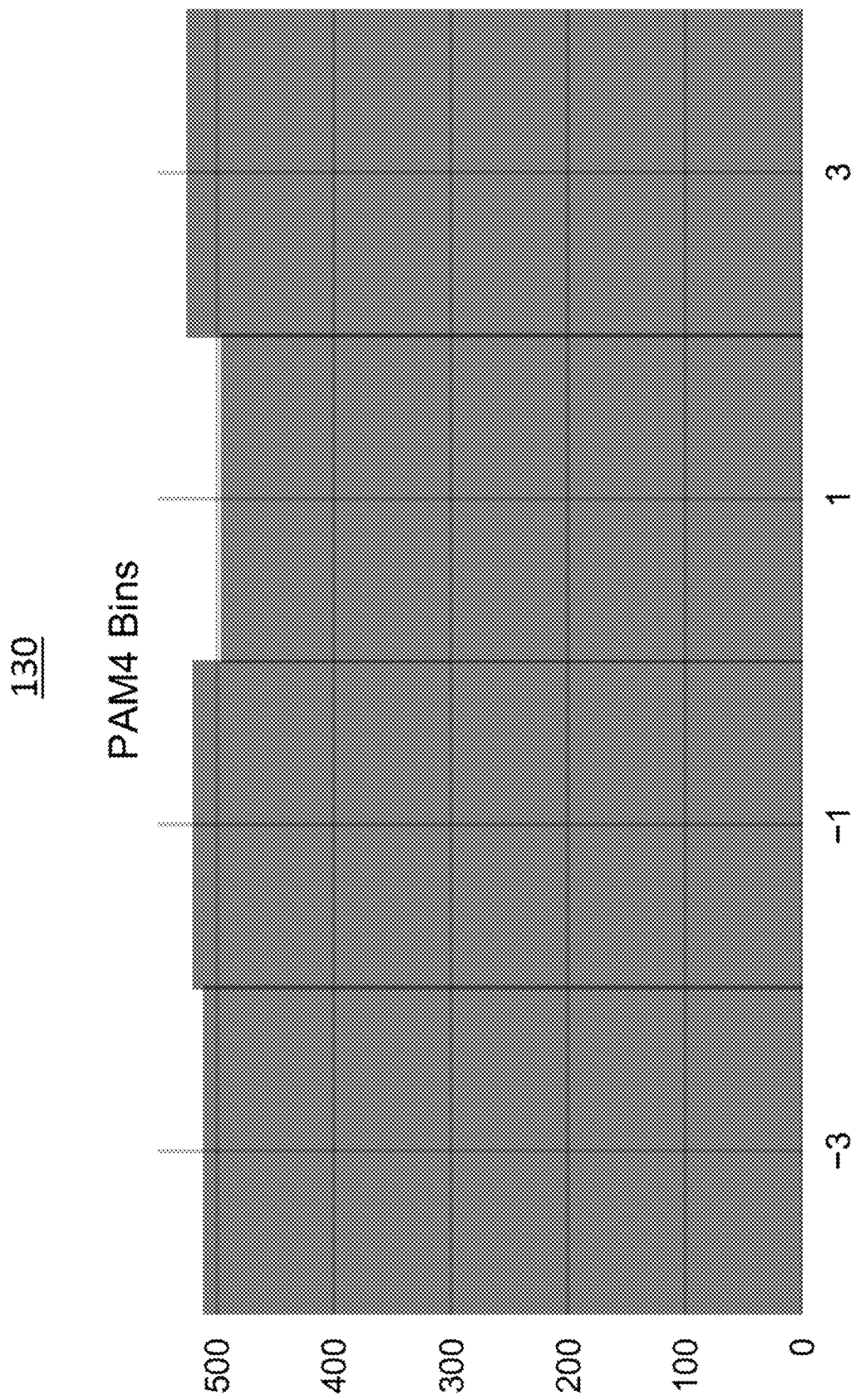
FIG. 11 is a bar graph showing a statistical distribution of PAM4 slice bins.

FIG. 8 shows a scatter chart 100 of samples taken from a PAM4 signal by a low-speed, high resolution ADC configured according to an embodiment of the present invention. The samples may be taken over any time period of interest and may be used to calculate statistics attributable to the samples that may be predictive of signal deviation or impairment, such as, but not limited to, mean, standard deviation, variance, peak-to-peak value, center value, median, maxima and minima. Signal amplitudes are plotted along the vertical axis, and time along the horizontal. This scatter chart shows horizontal clusters of samples, each having values that vary above and below one of four nominal PAM4 levels. In one implementation, a center value statistic generated by the setpoint module 92 may represent a midpoint between peak-to-peak distributions of any of the four clusters shown in the scatter chart. FIG. 9 shows a histogram 110 derived from a similar set of samples. Here signal amplitudes are shown along the horizontal axis, with the total count of instances plotted along the vertical. In one implementation, a median value statistic generated by the setpoint module 92 may represent a peak value of any one of the four distributions shown in the histogram. FIG. 10 shows a bar graph 120 to illustrate a similar distribution of samples among CMP slicer bins, with signal amplitude on the horizontal and total count on the vertical. FIG. 11 shows a bar graph 130 to illustrate another statistical distribution of samples mapped into PAM4 bins, with each of four bins along the horizontal representing a nominal signal level and the count measured along the vertical, over a time period of interest.

Figure 12:
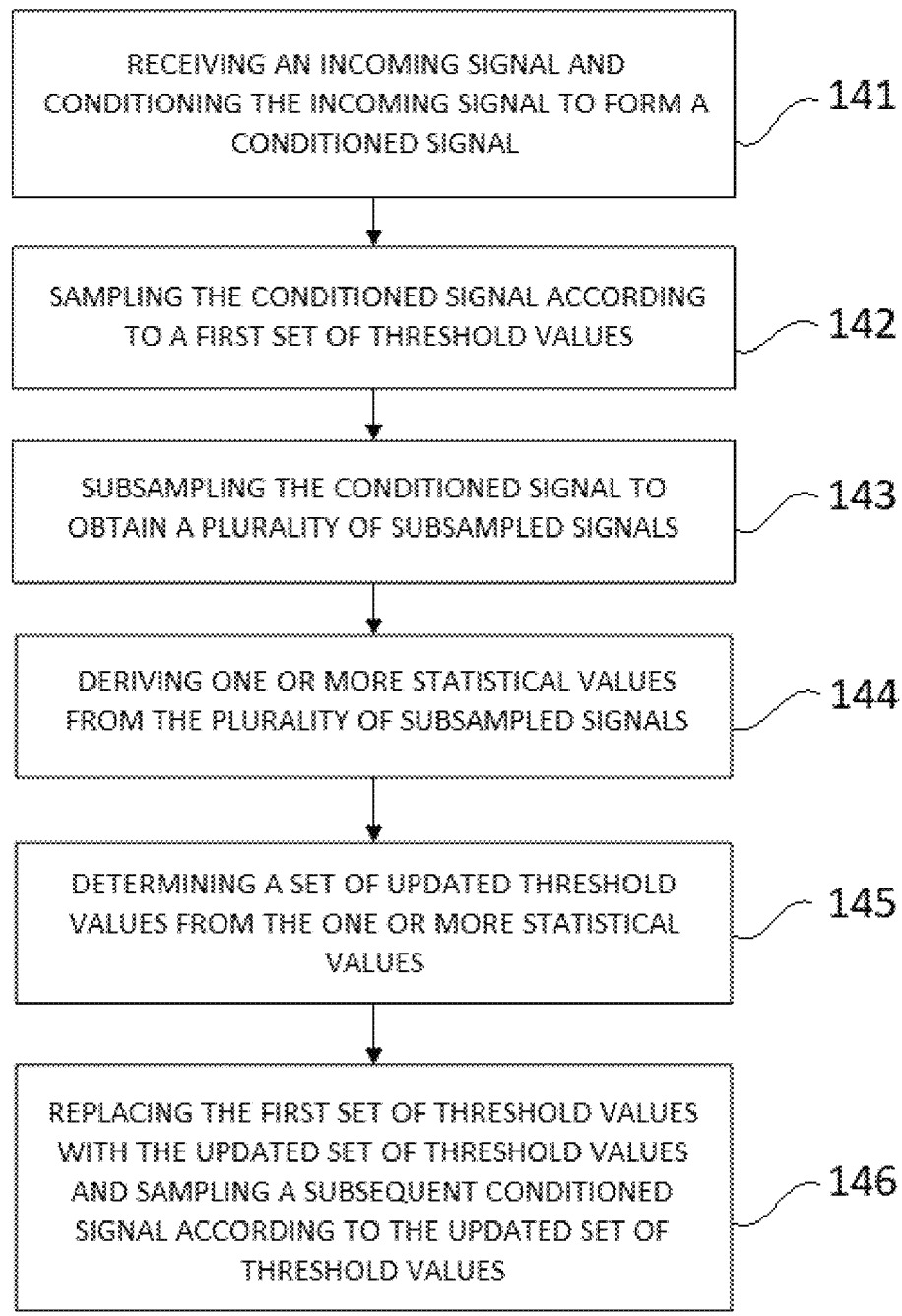
FIG. 12 is a process flow diagram illustrating salient steps in one embodiment of a method according to the invention for reducing SNR in an optical or electrical medium.

FIG. 12 shows a process flow diagram illustrating salient steps in one embodiment of a method 140 according to the invention for improving SNR in an optical or electrical medium. The process steps are to be interpreted in light of the disclosure herein. Method 140 begins at step 141, at which an incoming analog signal is received and conditioned to form a conditioned signal. At the next step 142, the conditioned signal is sampled according to a first set of threshold values. Next, at step 143, the conditioned signal is subsampled to obtain a plurality of subsampled signals. Next, at step 144, one or more statistical values are derived from the plurality of subsampled signals. Then at step 145 a set of updated threshold values is determined from the one or more statistical values. At the final step 146 the first set of threshold values is dynamically replaced with the updated set of threshold values and a subsequent conditioned signal is sampled according to the updated set of threshold values.

Exemplary embodiments of the invention have been disclosed in an illustrative style. Accordingly, the terminology employed throughout should be read in a non-limiting manner. Although minor modifications to the teachings herein will occur to those well versed in the art, it shall be understood that what is intended to be circumscribed within the scope of the patent warranted hereon are all such embodiments that reasonably fall within the scope of the advancement to the art hereby contributed, and that that scope shall not be restricted, except in light of the appended claims and their equivalents.

What is claimed is:

1. Circuitry in communication with an optical or electrical medium, the circuitry comprising:
   an analog front end (AFE) to convert an analog signal received from the optical or electrical medium into an analog conditioned signal;
   a low-resolution analog-to-digital converter (ADC) to digitize the analog conditioned signal according to a first set of threshold values;
   a high-resolution ADC to subsample the analog conditioned signal to generate a plurality of subsampled signals; and a microprocessor in communication with the low-resolution ADC and the high-resolution ADC, the processor configured to
derive one or more statistical values from the plurality of subsampled signals;
determine an updated set of threshold values from the one or more statistical values; and
dynamically replace the first set of threshold values for the low-resolution ADC with the updated set of threshold values.

2. The circuitry of claim 1, wherein the low-resolution ADC is further configured to digitize the analog conditioned signal according to a first set of nominal values, and wherein the microprocessor determines a set of updated nominal values as a function of one or more of the statistical values.

3. The circuitry of claim 1, wherein the low-resolution ADC digitizes the analog conditioned signal by (1) sampling the analog conditioned signal to obtain a plurality of sampled signal values, (2) comparing the plurality of sampled signal values with the first set of threshold values, and (3) assigning binary codes to the sampled signal values based on the comparison.

4. The circuitry of claim 1, wherein the AFE comprises one or both of a feed-forward equalizer (FFE) and a decision feedback equalizer (DFE).

5. The circuitry of claim 1, wherein the statistical values comprise one or more of a mean value, a standard deviation, a peak to peak value, and a center value.

6. The circuitry of claim 5, wherein the center value substantially defines a midpoint between peak-to-peak distributions of the plurality of subsampled signals.

7. The circuitry of claim 5, wherein the center value substantially defines a geometric center of an eye diagram derived from superimposed waves of the analog conditioned signal.

8. The circuitry of claim 1, wherein the set of updated threshold values is determined by the microprocessor executing a program stored in memory.

9. The circuitry of claim 8, wherein the set of updated threshold values are determined on chip or off chip.

10. The circuitry of claim 1, wherein the AFE further comprises signal conditioning circuitry, sampling circuitry, and amplifier circuitry.

11. The circuitry of claim 10, wherein the sampling circuitry comprises a track-and-hold circuitry.

12. The circuitry of claim 10, wherein the amplifier circuitry attenuates or amplifies the analog signal.

13. The circuitry of claim 1, further comprising a plurality of track-and-hold and sample-and-hold circuits, to respectively, sample and re-sample the analog conditioned signal.

14. The circuitry of claim 1, further comprising a plurality of low-resolution ADCs and a plurality of high-resolution ADCs, to respectively, sample and subsample the analog conditioned signal and digitize it to a binary value.

15. The circuitry of claim 1, wherein at least one updated threshold value in the set of updated threshold values is determined as a function of successive signals subsampled from the analog conditioned signal.

16. The circuitry of claim 15, wherein the at least one updated threshold value is determined at one or more of start up, periodically, or conditionally.

17. The circuitry of claim 1, wherein the low-resolution ADC samples the analog conditioned signal at a rate between about 100 MS/s and 100 GS/s and wherein the high-resolution ADC subsamples the analog conditioned signal at a rate between about 100 (MS/s)/m and 100 (GS/s)/m, wherein m is an integer greater than 1.

18. The circuitry of claim 1, wherein the high-resolution ADC is further configured to store the subsampled conditioned signals at a capacity of k samples, each k sample having n bits resolution, where k and n are integers.

19. The circuitry of claim 1, wherein the subsampled conditioned signals are obtained from optical or electrical signals.

20. A system on chip (SOC) to digitize a four-level pulse amplitude modulated (PAM4) signal, comprising:
a low-resolution ADC to receive and digitize an analog conditioned signal according to a first set of threshold values;
a high-resolution ADC to subsample the analog conditioned signal to generate a plurality of subsampled signals; and
a microprocessor in communication with the low-resolution ADC and the high-resolution ADC, the processor configured to
derive one or more statistical values from the plurality of subsampled signals;
determine a set of updated threshold values from the one or more statistical values; and
dynamically replace the first set of threshold values for the low-resolution ADC with the updated set of threshold values.

* * * * *